(12) United States Patent
Choi et al.

(10) Patent No.: US 10,181,577 B1
(45) Date of Patent: Jan. 15, 2019

(54) ENCAPSULATION FILM AND ORGANIC ELECTRONIC DEVICE COMPRISING THE SAME

(71) Applicant: LG CHEM, LTD., Seoul (KR)

(72) Inventors: Ban Seok Choi, Daejeon (KR); Hyun Jee Yoo, Daejeon (KR); Hyun Suk Kim, Daejeon (KR); Seung Min Lee, Daejeon (KR); Jung Ok Moon, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/119,600

(22) Filed: Aug. 31, 2018

Related U.S. Application Data

(63) Continuation of application No. 15/116,167, filed as application No. PCT/KR2015/001659 on Feb. 17, 2015, now Pat. No. 10,096,797.

(30) Foreign Application Priority Data

Feb. 18, 2014 (KR) .......... 10-2014-0018669
Jun. 13, 2014 (KR) .......... 10-2014-0071989
Sep. 29, 2014 (KR) .......... 10-2014-0130495

(51) Int. Cl.
*H01L 51/52* (2006.01)
*H01L 51/56* (2006.01)
(Continued)

(52) U.S. Cl.
CPC .......... *H01L 51/5253* (2013.01); *C08J 5/18* (2013.01); *C08L 63/00* (2013.01); *H01L 51/0035* (2013.01); *H01L 51/5012* (2013.01); *H01L 51/529* (2013.01); *H01L 51/5218* (2013.01); *H01L 51/5234* (2013.01);
(Continued)

(58) Field of Classification Search
CPC .......... H01L 51/0035; H01L 51/5012; H01L 51/5281; H01L 51/5284; H01L 51/529; H01L 51/56; H01L 51/5253
See application file for complete search history.

(56) References Cited

U.S. PATENT DOCUMENTS 8,742,411 B2 6/2014 Yoo et al.
8,860,233 B2 10/2014 Nishihata
(Continued)

FOREIGN PATENT DOCUMENTS

CN 1832643 A 9/2006
EP 1352930 A2 10/2003
(Continued)

OTHER PUBLICATIONS

U.S. Appl. No. 15/116,167, filed Aug. 2, 2016.

*Primary Examiner* — Anne M Hines
(74) *Attorney, Agent, or Firm* — Dentons US LLP

(57) ABSTRACT

Provided are an encapsulation film, an organic electronic device comprising the same, and a method of manufacturing the organic electronic device. When the organic electronic device is encapsulated using the encapsulation film, an excellent moisture barrier property may be realized, and as reflection or scattering of light is prevented by absorbing and blocking internal or external light, external defects of the organic electronic device may be prevented.

25 Claims, 3 Drawing Sheets

(51) Int. Cl.
    *C08J 5/18*    (2006.01)
    *C08L 63/00*   (2006.01)
    *H01L 51/00*   (2006.01)
    *H01L 51/50*   (2006.01)
(52) U.S. Cl.
    CPC ...... *H01L 51/5259* (2013.01); *H01L 51/5284* (2013.01); *H01L 51/56* (2013.01); *B32B 2457/206* (2013.01); *C08J 2363/00* (2013.01); *C08J 2463/04* (2013.01); *C08J 2471/12* (2013.01); *H01L 51/5243* (2013.01); *H01L 2251/301* (2013.01); *H01L 2251/303* (2013.01)

(56) References Cited

U.S. PATENT DOCUMENTS

| | | | |
|---|---|---|---|
| 9,508,959 | B2 | 11/2016 | Washio |
| 2003/0025855 | A1* | 2/2003 | Holman ............ G02F 1/133305 349/86 |
| 2005/0007653 | A1* | 1/2005 | Honeyman ............... B32B 7/06 359/321 |
| 2006/0214312 | A1 | 9/2006 | Wu et al. |
| 2011/0049496 | A1* | 3/2011 | Fukuzaki ............ C07F 15/0033 257/40 |
| 2013/0069105 | A1* | 3/2013 | Shi ....................... H01L 51/524 257/100 |
| 2015/0022936 | A1* | 1/2015 | Cox ....................... H05K 3/285 361/234 |
| 2015/0048356 | A1 | 2/2015 | Lee et al. |
| 2015/0188085 | A1 | 7/2015 | Yoo et al. |
| 2015/0378182 | A1* | 12/2015 | Shin .................... H01L 51/5284 257/40 |
| 2017/0166715 | A1* | 6/2017 | Choi .................... H01L 51/5253 |

FOREIGN PATENT DOCUMENTS

| | | |
|---|---|---|
| JP | 04-190362 A | 7/1992 |
| JP | 2000268954 A | 9/2000 |
| JP | 2002319485 A | 10/2002 |
| JP | 2006171228 A | 6/2006 |
| JP | 2006179491 A | 7/2006 |
| JP | 2010-134352 A | 6/2010 |
| JP | 2012097282 A | 5/2012 |
| JP | 2014500586 A | 1/2014 |
| KR | 1020060070166 A | 6/2006 |
| KR | 1020120001148 A | 1/2012 |
| KR | 1020130053038 A | 5/2013 |
| KR | 10-1561103 B1 | 10/2015 |
| TW | 200540221 A | 12/2005 |
| TW | 201004995 A1 | 2/2010 |
| TW | 201228046 A | 7/2012 |
| TW | 201341190 A | 10/2013 |
| TW | 201341461 A | 10/2013 |
| WO | 2005105919 A1 | 11/2005 |
| WO | 2013103281 A1 | 7/2013 |
| WO | 2013/168619 A1 | 11/2013 |
| WO | 2014021697 A1 | 2/2014 |

* cited by examiner

ENCAPSULATION FILM AND ORGANIC ELECTRONIC DEVICE COMPRISING THE SAME

This application is a Continuation of U.S. patent application Ser. No. 15/116,167 filed Aug. 2, 2016, now allowed, which is the U.S. National Phase application of International Application No. PCT/KR2015/001659 filed on Feb. 17, 2015, which claims the benefit of Korean Patent Application No. 10-2014-0018669, filed Feb. 18, 2014, Korean Patent Application No. 10-2014-0071989, filed Jun. 13, 2014, and Korean Patent Application No. 10-2014-0130495, filed Sep. 29, 2014, all of which are hereby incorporated by reference in their entirety for all purposes as if fully set forth herein.

BACKGROUND

1. Field of the Invention

The present invention relates to an encapsulation film, an organic electronic device (OED) comprising the same, and a method of manufacturing the OED.

2. Discussion of Related Art

An OED refers to a device including an organic material layer generating an exchange of charges using holes and electrons. Examples of the OEDs may include a photovoltaic device, a rectifier, a transmitter, and an organic light emitting diode (OLED).

In one exemplary embodiment, an OLED has less power consumption and a higher response speed, and is advantageous in forming a thinner display device or light than a conventional light source. Since the OLED also has excellent space utilization, the OLED is expected to be applied in various fields including all types of portable devices, monitors, notebook computers and TVs.

To expand commercialization and use of the OLED, the most important problem is durability. Organic materials and metal electrodes included in the OLED are very easily oxidized by external factors such as moisture. In addition, when a display is realized by applying the OLED, a part in which an electrical connection is deposited on a outer peripheral part of the display, and a part in which an electrical connection is not deposited on a outer peripheral part of the display are included. In the non-deposited part, internal or external light may be reflected or scattered, and some parts seen bright from an outside cause a external defect.

SUMMARY OF THE INVENTION

The present invention is directed to providing an encapsulation film which has an excellent moisture barrier property and is capable of preventing a external defect of an OED by absorbing and blocking internal or external light to prevent reflection or scattering of the light, an OED having the same, and a method of manufacturing an OED.

Hereinafter, exemplary embodiments of the present invention will be described in further detail with respect to the accompanying drawings. In addition, to explain the present invention, related known detail description for a common function or configuration is omitted. In addition, the accompanying drawings are provided to help in understanding the present invention, and to more clearly explain the present invention, parts not relating to the description are omitted. To clearly express several layers and regions in the drawing, thicknesses or sizes are exaggerated. The scope of the present invention is not limited to thicknesses, sizes and ratios represented in the drawings.

In one aspect, the present invention provides a film for encapsulating an organic electronic element. The encapsulation film of the present invention may be applied to encapsulate or capsulate an entire area of the organic electronic element such as an OLED.

The exemplary encapsulation film may include a light absorbing region. In one example, the light absorbing region may comprise an encapsulation resin and a light absorbing material. In the present invention, the light absorbing region may mean a region having a surface resistance of $10^{11}$ $\Omega/cm^2$ or more in the encapsulation film. In another exemplary embodiment of the present invention, the encapsulation film may include a light absorbing layer including a light absorbing region, which comprises an encapsulation resin and a light absorbing material and has a surface resistance of $10^{11}$ $\Omega/cm^2$ or more; and a moisture barrier layer. In another aspect, the present invention provides an OED, which includes a substrate, an organic electronic element present on the substrate and an encapsulation film having the light absorbing region attached to an entire surface of the organic electronic element. Meanwhile, the light absorbing region may mean a region including a light absorbing material in a thickness direction when the encapsulation film is formed in two or more layers. That is, in this case, a part of the moisture barrier layer may be defined as the light absorbing region, in addition to a part of the light absorbing layer.

The term "OED" used herein means a product or device having an element including an organic material layer generating an exchange of charges using holes and electrons between a pair of electrodes facing each other, and as an example, a photovoltaic device, a rectifier, a transmitter and an OLED may be included, but the present invention is not limited thereto. In one example of the present invention, the OED may be an OLED.

The term "light absorbing layer" or "moisture barrier layer" used herein may be an adhesive layer, a pressure-sensitive adhesive layer or a curable pressure-sensitive adhesive layer, which forms the encapsulation film. Accordingly, when needed, the encapsulation film and the light absorbing layer and/or the moisture barrier layer may be mutually used with the same meaning. Here, the term "curable pressure-sensitive adhesive layer" used herein means a type of adhesive layer which is maintained in a solid or semi-solid state at room temperature to attach an adherend without bubbles due to flowability generated when heated and tightly fix the adherend using an adhesive after solidifying. In one exemplary embodiment, the "light absorbing layer" means a layer including the light absorbing region. In addition, in one exemplary embodiment, the "moisture barrier layer" means a layer having a water vapor transmission rate (WVTR) of 50 $g/m^2 \cdot day$ or less, preferably 30 $g/m^2 \cdot day$ or less, more preferably 20 $g/m^2 \cdot day$ or less, and further more preferably, 15 $g/m^2 \cdot day$ or less. In the present invention, the WVTR is a rate measured with respect to a thickness direction of a crosslinked product or cured product at 38° C. and a relative humidity of 100% after an encapsulation resin which will be described below is crosslinked or cured, and a crosslinked product or a cured product is formed in a film shape having a thickness of 80 μm. In addition, the WVTR is measured according to ASTM F1249. As the WVTR is controlled in the above range, permeation of moisture, vapor or oxygen into an encapsulation product of the OED may be effectively inhibited. In the present invention, as a level of the WVTR of the encapsulation film is lower, an encapsulation structure exhibits an excellent performance. The lower limit of the WVTR may be, but is not particularly limited to, for example, 0, 1 or 3 g/m²·day. The moisture barrier layer may include an encapsulation resin, and further include a moisture absorbent. Components constituting the moisture barrier layer, for example, the encapsulation resin or the moisture absorbent, may be equal to or different from the components constituting the light absorbing layer.

The term "encapsulation composition" used herein is a component constituting the light absorbing layer or moisture barrier layer of the encapsulation film. The encapsulation composition may include an encapsulation resin, a light absorbing material, a moisture absorbent, or other additives. In the light absorbing layer and the moisture barrier layer of the encapsulation film, types and contents of the components of the encapsulation composition, excluding the light absorbing material, for example, the encapsulation resin, the moisture absorbent, other additives or a filler may be the same as or different from each other. Unless particularly cited otherwise, description on the encapsulation composition which will be described below corresponds to all of the light absorbing layer and the moisture barrier layer of the encapsulation film.

In one example, a structure of the encapsulation film is not particularly limited. The encapsulation film has a single layer structure or a multilayer structure including at least two layers. In one example, when the encapsulation film has a single layer structure, the above-described light absorbing layer may be included, and when the encapsulation film has a multilayer structure having at least two layers, the above-described light absorbing layer and the moisture barrier layer may be included.

FIG. 1 is a cross-sectional view of an encapsulation film according to the present invention. An exemplary encapsulation film 1 may include a light absorbing layer 2. In addition, as shown in FIGS. 2 to 4, the encapsulation film 1 may have a multilayer structure having at least two layers, and in this case, the encapsulation film 1 may include at least one light absorbing layer 2. In one example, when the encapsulation film 1 has a single layer structure as shown in FIG. 1, the light absorbing layer 2 may be included. Specifically, when the encapsulation film 1 includes a single layer structure, as shown in FIG. 1($a$), the light absorbing layer may include a light absorbing material 3, or as shown in FIG. 1($b$), the light absorbing layer may include a light absorbing material 3 and a moisture absorbent 5. In addition, as shown in FIG. 2, when the encapsulation film 1 has a bilayer structure, a light absorbing layer 2 and a moisture barrier layer 4 may be included. When the encapsulation film has a multilayer structure, a sequence of stacking a light absorbing layer and a moisture barrier layer is not particularly limited. In addition, when the encapsulation film has a multilayer structure including at least three layers, the moisture barrier layer may have a multilayer structure. When the moisture barrier layer has a multilayer structure, the light absorbing layer may be disposed between the at least two moisture barrier layers, or may be formed on one or both surfaces of a structure in which at least two moisture barrier layers are stacked. FIG. 3 shows that the light absorbing layer 2 is disposed between two moisture barrier layers 4 and 6, and one (the moisture barrier layer 6) of the two moisture barrier layers does not include a moisture absorbent 5 or includes a small amount of the moisture absorbent 5 in consideration of being encapsulated in contact with an organic electronic element. FIG. 4 shows that the light absorbing layer 2 is formed on one surface of a structure in which the two moisture barrier layers 4 and 6 are stacked, and one (the moisture barrier layer 6) of the two moisture barrier layers 4 and 6 does not include a moisture absorbent 5 or includes a small amount of the moisture absorbent 5 in consideration of being encapsulated in contact with an organic electronic element. In addition, the encapsulation film may include at least two light absorbing layers. In this case, two light absorbing layers may be continuously stacked, and the moisture barrier layer may be included between the two light absorbing layers.

In an exemplary embodiment of the present invention, the encapsulation film may include a light absorbing region comprising an encapsulation resin and a light absorbing material as described above, and having a surface resistance of $10^{11}$ Ω/cm² or more. In the encapsulation film, a non-light absorbing region, not the light absorbing region, may consist of the same components as those constituting the light absorbing region, except that a light absorbing material is not included.

When a display is realized using an OLED, a part of the display in which an electrical connection is deposited on a side surface thereof, and a part of the display in which an electrical connection is not deposited are included. Accordingly, in the non-deposited part, external light may be reflected or scattered, and here, the light absorbing region of the encapsulation film serves to absorb and block reflected or scattered light.

A part of the encapsulation film in which the light absorbing region is formed is not particularly limited, but for example, the light absorbing region may be formed in at least one outer peripheral part of the encapsulation film. The term "outer peripheral part" used herein means an edge. That is, the outer peripheral part of the film may mean an edge of a circumference of the film. In another exemplary embodiment, the light absorbing region may be formed in an entire area of the encapsulation film. That is, when the encapsulation film is observed in a plan view, the entire area of the encapsulation film may have a surface resistance of $10^{11}$ Ω/cm² or more, or only at least one outer peripheral part of the encapsulation film may have a surface resistance of $10^{11}$ Ω/cm² or more. In the present invention, when the film has a single layer structure, the surface resistance may be a surface resistance measured with respect to the light absorbing region of the single layer. In addition, when the film has a multilayer structure, the surface resistance may be a surface resistance measured in the multilayer stacked structure including at least one light absorbing layer and/or at least one moisture barrier layer. For example, the above-described light absorbing region may be a region including a light absorbing material, and having a surface resistance measured with respect to a surface of the encapsulation film in contact with the organic electronic element of $10^{11}$ Ω/cm² or more. In addition, in one example, the upper limit of the surface resistance of the encapsulation film according to the present invention may be, but is not particularly limited to, for example, $10^{18}$ Ω/cm². The surface resistance may be, for example, $10^{11}$ Ω/cm² or more, $10^{12}$ Ω/cm² or more, $10^{13}$ Ω/cm² or more, $10^{14}$ Ω/cm² or more or $10^{15}$ Ω/cm² or more. As the range of the surface resistance is measured and controlled, conductivity of the encapsulation film may be adjusted in a suitable range. When the encapsulation film including a light absorbing material is applied in encapsulation of the OED, when the film has electric conductivity, abnormal driving of the OED is induced. Accordingly, as a unit for adjusting conductivity of the encapsulation film, the surface resistance may be measured to control. The surface resistance may be measured by a conventional method known in the art. For example, the surface resistance may be measured according to a standard test method using a surface resistance meter, MCP-HT450, manufactured by Mitsubishi Chemical Corporation. In one example, for the measurement of the surface resistance, a surface resistance of a light absorbing region of the encapsulation film from which a releasing film is removed is measured, and a value of the surface resistance is measured after applying a voltage of 500 V for 1 minute at 23° C. and 50% R.H.

FIGS. 5 to 8 are plan views of an encapsulation film of the present invention.

As described above, in the encapsulation film, as shown in FIG. 5, a light absorbing region may be formed in an entire area of the encapsulation film, but the present invention is not limited. That is, when the encapsulation film is observed in the plan view, as shown in FIGS. 6 to 8, the light absorbing region may be formed in at least one outer peripheral part. That is, when a region of the encapsulation film 1 in which a light absorbing material is included is referred to as a light absorbing region or a first region 10, and a region in which a light absorbing material is not included is referred to as a non-light absorbing region or a second region 11, the entire area of the encapsulation film may be the first region 10. Alternatively, only one outer peripheral part of the encapsulation film 1 may be the first region 10. Here, a thickness of the outer peripheral part may be suitably adjusted. That is, as shown in FIG. 6, one of four outer peripheral parts is the first region 10, and the others may be the second regions 11. Alternatively, as shown in FIG. 8, all four outer peripheral parts may be the first regions 10. Here, a thickness of each outer peripheral part may be suitably adjusted according to a field and application to which the encapsulation film is applied by those of ordinary skill in the art. In addition, the term "first region 10" used herein may be used with the same meaning as the above-described light absorbing region.

In an exemplary embodiment of the present invention, the encapsulation film may have a haze of 40 to 90%, 55 to 85%, or 60 to 80%. The haze may be measured by a conventional method known in the art, and when the film is formed in a single layer structure, the haze may be measured to an entire area of the film, and when the film is formed in a multilayer structure, the haze may be measured to an entire area of the film having a multilayer stacked structure. For example, the haze may be measured according to a JIS K7105 standard test method using a haze meter. The haze value may be controlled in a suitable range according to a desired use of the encapsulation film by those of ordinary skill in the art. In addition, the haze value may be controlled in the above-described specific range by a method of adjusting a content or diameter of a moisture absorbent or filler which will be described below. As the haze vale is controlled to be maintained at 40% or more, it can be confirmed that the moisture barrier performance is maintained without a reaction of the moisture absorbent with moisture in the air in the process of manufacturing a film.

In one example, the light absorbing region of the encapsulation film may have a light transmittance of 15% or less with respect to a visible light region. In the present invention, when the film is formed in a single layer structure, the light transmittance may be a light transmittance with respect to a visible light region, which is measured in a thickness direction of the light absorbing region. In addition, when the film is formed in a multilayer structure, the light transmittance may be a light transmittance measured in the multi-layer stacked structure including at least one light absorbing layer and/or at least one moisture barrier layer. For example, when the encapsulation film according to the present invention is observed in the plan view, the above-described light absorbing region may be a region having a light transmittance of 15% or less in a thickness direction of the film having a stacked structure. In one example, the lower limit of the light transmittance in the visible light region according to the present invention may be, but is not particularly limited to, 0%. The light transmittance may be, for example, 0.2 to 15%, 0.5% to 15%, 1% to 15%. 1% to 14%, 1% to 13%, 2% to 12%, 3% to 11%, or 3% to 10%. Particularly, when the display is realized using an OLED, a part of the display in which an electrical connection is deposited on a side surface, and a part in which an electrical connection is not deposited are included. Accordingly, in the non-deposited part, external light may be reflected or scattered, and here, the encapsulation film serves to absorb and block reflected or scattered light. In one example, the light transmittance may be measured at 550 nm using an UV-Vis spectrometer.

In the present invention, an encapsulation composition constituting the light absorbing layer or moisture barrier layer may be formed of a known material. For example, as described above, the encapsulation composition constituting the light absorbing layer may include the encapsulation resin and the light absorbing material. In addition, a type or content of the light absorbing material may be adjusted for the light absorbing region of the encapsulation film to have the above range of surface resistance or light transmittance by those of ordinary skill in the art.

In one exemplary embodiment of the present invention, a type of the encapsulation resin constituting the encapsulation composition is not particularly limited. The encapsulation resin described herein may be included in all of the light absorbing layer and the moisture barrier layer.

In one example, the encapsulation resin may be solid or semi-solid, preferably solid, at room temperature. Here, when the resin is solid or semi-solid at room temperature, the resin may not have flowability at room temperature. For example, the "solid or semi-solid at room temperature" used herein may mean that a viscosity of a target at room temperature is approximately $10^6$ poise or more or approximately $10^7$ poise or more. Here, the viscosity is measured at a strain of 5% and a frequency of 1 Hz using an Advanced Rheometric Expansion System (ARES).

When the encapsulation resin is solid or semi-solid at room temperature, it can be maintained in a film or sheet shape in an uncured state. Accordingly, in encapsulation or capsulation of the organic electronic element using the encapsulation film, physical or chemical damage applied to the element may be prevented, and the process may be smoothly performed. In addition, the addition of bubbles during the encapsulation or capsulation of the organic electronic element or the decrease in a life span of the element may be prevented. The upper limit of the viscosity of the encapsulation resin is not particularly limited, and may be controlled in a range of approximately $10^9$ poise or less, for example, in consideration of processability.

For example, the encapsulation resin may be an acrylic resin, an epoxy resin, a silicone resin, a fluorine resin, a styrene resin, a polyolefin resin, a thermoplastic elastomer, a polyoxyalkylene resin, a polyester resin, a polyvinylchloride resin, a polycarbonate resin, a polyphenylenesulfide resin, a polyamide resin or a mixture thereof.

Here, the styrene resin may be, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer or a mixture thereof. The olefin resin may be, for example, a high density polyethylene-based resin, low density polyethylene-based resin, polypropylene-based resin or a mixture thereof. The thermoplastic elastomer may be, for example, an ester-based thermoplastic elastomer, an olefin-based thermoplastic elastomer or a mixture thereof. Here, as the olefin-based thermoplastic elastomer, a polybutadiene resin or a polyisobutylene resin may be used. As the polyoxyalkylene resin, for example, a polyoxymethylene-based resin, polyoxyethylene-based resin or a mixture thereof may be used. As the polyester resin, for example, a polyethylene terephthalate-based resin, polybutylene terephthalate-based resin or a mixture thereof may be used. As the polyvinylchloride resin, for example, polyvinylidene chloride may be used. In addition, a mixture of a hydrocarbon resin, for example, hexatriacotane or paraffin may be used. As the polyamide resin, for example, nylon may be used. As the acrylate resin, for example, polybutyl(meth)acrylate may be used. As the silicone resin, for example, polydimethylsiloxane may be used. In addition, as the fluorine resin, a polytrifluoroethylene resin, a polytetrafluoroethylene resin, polychlorotrifluoroethylene resin, polyhexafluoropropylene resin, polyvinylidene fluoride, polyvinyl fluoride, polyethylenepropylene fluoride or a mixture thereof may be used.

The above-listed resin may be grafted to, for example, maleic anhydride, polymerized with another one of the listed resins or a monomer for preparing a resin, or modified by a different compound. As an example of the different compound, a carboxyl-terminated butadiene-acrylonitrile copolymer may be used.

In one example, the encapsulation resin of the encapsulation composition may include a polyisobutylene-based resin. The polyisobutylene-based resin may have a low WVTR and a low surface energy due to hydrophobicity. Specifically, as the polyisobutylene-based resin, for example, a homopolymer of an isobutylene monomer; or a copolymer prepared by copolymerizing another monomer polymerized with an isobutylene monomer. Here, the another monomer polymerized with an isobutylene monomer may be, for example, 1-butene, 2-butene, isoprene or butadiene. In one example, the copolymer may be butyl rubber.

As a component for the encapsulation resin, a base resin having a weight average molecular weight (Mw) capable of being molded in a film shape may be used. In one example, a range of the weight average molecular weight capable of being molded in a film shape may be approximately 100,000 to 2,000,000, 100,000 to 1,500,000, or 100,000 to 1,000,000. The term "weight average molecular weight" used herein means a conversion value with respect to standard polystyrene measured by gel permeation chromatography (GPC).

In addition, as the component for the encapsulation resin, one or at least two of the above components may be used. When at least two components are used, at least two different types of resins, at least two resins having different weight average molecular weights, or at least two different types of resins having different weight average molecular weights may be used.

In still another exemplary embodiment, the encapsulation resin according to the present invention may be a curable resin. A specific type of the curable resin which can be used in the present invention is not particularly limited, and for example, various heat-curable or photocurable resins known in the art may be used. The term "heat-curable resin" means a resin which can be cured through a process of suitably applying heat or an aging process, and the term "photocurable resin" means a resin which can be cured by radiation of electromagnetic waves. In addition, the curable resin may be a dual curable resin including all heat curing and photocuring characteristics. In one example, the curable resin of the present invention may be a heat-curable resin, not a photocurable resin, in consideration that the encapsulation composition is composed of the curable resin with a light absorbing material which will be described below, but the present invention is not limited thereto.

A specific type of the curable resin in the present invention may be any type having the above-described characteristics without particular limitation. For example, the curable resin may have an adhesive characteristic by curing, and may be a resin including at least one heat-curable functional group such as a glycidyl group, an isocyanate group, a hydroxyl group, a carboxyl group or an amide group, or a resin including at least one functional group which can be cured by radiation of electromagnetic waves such as an epoxide group, a cyclic ether group, a sulfide group, an acetal group or a lactone group. In addition, a specific type of the above-described resin may be an acryl resin, a polyester resin, an isocyanate resin or an epoxy resin, but the present invention is not limited thereto.

In the present invention, as the curable resin, an aromatic or aliphatic, or linear, or branched epoxy resin may be used. In one exemplary embodiment of the present invention, an epoxy resin comprising at least two functional groups and having an epoxy equivalent of 180 to 1,000 g/eq may be used. As the epoxy resin having the above range of epoxy equivalent is used, properties of the cured product such as adhesive performance and a glass transition temperature may be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene modified phenol-type epoxy resin.

In the present invention, as the curable resin, an epoxy resin including a cyclic structure in a molecular structure may be used, or an epoxy resin including an aromatic group (for example, a phenyl group) may be used. When the epoxy resin includes an aromatic group, a cured product may have excellent thermal and chemical stabilities, and exhibit a low moisture absorption amount, and thus reliability of the encapsulation structure of the OED may be enhanced. As a specific example of the epoxy resin comprising an aromatic group which can be used in the present invention, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xylol-based epoxy resin, a multifunctional epoxy resin, a phenol novolac epoxy resin, a triphenolmethane-type epoxy resin and an alkyl-modified triphenolmethane epoxy resin may be used, but the present invention is not limited thereto.

In the present invention, as the epoxy resin, a silane-modified epoxy resin, or a silane-modified epoxy resin having an aromatic group may be used. Likewise, when an epoxy resin which has a silane group structurally modified by a silane is used, an adhesive property to a glass substrate or an inorganic material of the substrate of the OED may be maximized, and a moisture barrier property or durability and reliability may be enhanced. A specific type of the epoxy resin which can be used in the present invention is not particularly limited, and such a resin may be easily obtained from a manufacturer such as Kukdo Chemical, Co., Ltd.

In an exemplary embodiment of the present invention, a light absorbing region of the encapsulation film may include a light absorbing material, and the type or content of the light absorbing material may be appropriately controlled by those of ordinary skill in the art to satisfy the above-described range of the light transmittance of the film.

The term "light absorbing material" used herein may be a material which can absorb visible rays, for example, a pigment or a dye.

In one example, the light absorbing material may be a non-conductive material. When the encapsulation composition including the light absorbing material is manufactured in a film shape to be applied in encapsulation of the OED, if the film has electric conductivity, a defect in driving of the OED is induced. Accordingly, as a non-conductive material is used as a light absorbing material, the surface resistance of the film may be limited in the above-described range, a defect in driving of the OED according to electric conductivity of the film may be prevented.

The light absorbing material is not particularly limited, but may be, for example, a pigment or a dye. In one example, the light absorbing material may be any material capable of absorbing light in an entire range of wavelength or a specific wavelength range, and may be, but is not particularly limited to, for example, carbon black, carbon nanotube, fluorene (C6), a phthalocyanine derivative, a porphyrin derivative, a triphenylamine derivative or a mixture thereof. In one example, the light absorbing material may be included at 0.01 parts by weight or more, 0.01 to 50 parts by weight, 0.6 to 40 parts by weight, 0.7 to 30 parts by weight, 0.8 to 20 parts by weight, 0.9 to 14 parts by weight, 1.0 to 13, or 1.0 to 12 parts by weight with respect to 100 parts by weight of the encapsulation resin. As the light absorbing material is adjusted within the above range, when the encapsulation composition is applied to an OED, internal or external light may be effectively absorbed and blocked to prevent reflection or scattering of the light.

In yet another exemplary embodiment, the light absorbing material may be adjusted to absorb a light source in a specific wavelength range as needed.

The light absorbing layer or moisture barrier layer of the encapsulation film of the present invention may include a moisture absorbent as needed. The term "moisture absorbent" may include all components which can adsorb or remove moisture or vapor permeated from an external environment through a physical or chemical reaction. That is, the moisture absorbent may be a moisture reactive adsorbent, a physical adsorbent, or a mixture thereof.

The moisture reactive adsorbent adsorbs moisture or vapor by a chemical reaction with vapor, moisture or oxygen permeated into the encapsulation film. The permeation to the physical adsorbent may be inhibited by extending a movement path of moisture or vapor permeated into the encapsulation structure, and the physical adsorbent may maximize a blocking property to moisture and vapor through interaction with a matrix structure of the encapsulation resin and the moisture reactive adsorbent A specific type of the moisture absorbent which can be used in the present invention is not particularly limited, and for example, the moisture reactive adsorbent may be one or a mixture of at least two of metal powders such as alumina, a metal oxide, a metal salt, and phosphorus pentoxide ($P_2O_5$), and the physical adsorbent may be silica, zeolite, titania, zirconia or montmorillonite.

Here, specifically, the metal oxide may be lithium oxide ($Li_2O$), sodium oxide ($Na_2O$), barium oxide (BaO), calcium oxide (CaO) or magnesium oxide (MgO), and the metal salt may be, but is not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

In the present invention, the moisture absorbent such as the metal oxide may be suitably processed, and mixed in the composition. For example, depending on the type of the OED to which the encapsulation film is applied, the encapsulating composition may be formed in the form of a thin film having a thickness of 30 µm or less, and in this case, a grinding process of the moisture absorbent may be needed. To grind the moisture absorbent, three-roll milling, bead milling or ball milling may be used.

The light absorbing layer or moisture barrier layer of the encapsulation film of the present invention may include the moisture absorbent at 0 to 100, 1 to 90, 5 to 80, or 10 to 60 parts by weight with respect to 100 parts by weight of the encapsulation resin. The moisture absorbent is an optional component, and thus may not be included. However, as the content of the moisture absorbent is controlled to 5 parts by weight or more, a cured product may exhibit an excellent moisture and vapor blocking property. In addition, as the content of the moisture absorbent is controlled to 100 parts by weight or less, a thin film-type encapsulation structure may be formed, and an excellent moisture barrier property may be exhibited.

In the specification, unless particularly defined otherwise, the unit "parts by weight" means a weight ratio between components.

In an exemplary embodiment of the present invention, the moisture absorbent may be suitably controlled according to a structure for encapsulating an organic electronic element. For example, in a layer in contact with the organic electronic element, the moisture absorbent may be included at 0 to 20% based on the total weight of the moisture absorbent in the encapsulation film. For example, as shown in FIGS. 3 and 4, when the element is in contact with one (the moisture barrier layer 6) of the two moisture barrier layers 4 and 6, which are sequentially stacked, during the encapsulation of the organic electronic element, the underlying moisture barrier layer 6 may include 0 to 20% of the moisture absorbent based on the total weight of the moisture absorbent, and the upper moisture barrier layer 4 which is not in contact with the organic electronic element may include 80 to 100% of the moisture absorbent based on the total weight of the moisture absorbent.

The light absorbing layer or moisture barrier layer of the encapsulation film of the present invention may include a filler, and preferably, an inorganic filler when needed. The filler may extend a movement path of moisture or vapor permeated into the encapsulation structure to inhibit the permeation, and maximize a blocking property to moisture and vapor through interaction with the matrix structure of the encapsulation resin and the moisture absorbent. A specific type of the filler which can be used in the present invention may be, but is not particularly limited to, for example, one or a mixture of at least two of clay, talc, and silica.

In addition, in the present invention, to increase binding efficiency to the filler and an organic binder, as the filler, a product whose surface is treated with an organic material may be used, or a coupling agent may be additionally added.

The light absorbing layer or moisture barrier layer of the encapsulation film of the present invention may include the filler at 0 to 50, 1 to 40, or 1 to 20 parts by weight with respect to 100 parts by weight of the encapsulation resin. In the present invention, the filler is an optional component, and may not be included in the encapsulation film. However, a content of the filler is controlled to 1 part by weight or more, and thus an encapsulation structure having an excellent moisture or vapor blocking property and physical properties may be provided. In addition, in the present invention, as the content of the filler is controlled to 50 parts by weight or less, the encapsulation film may be manufactured in a film shape, and even when the encapsulation film is manufactured in a thin film, a cured product may exhibit an excellent moisture barrier property.

The term "encapsulation structure" used herein may be the above-described encapsulation film having a single layer or multilayer structure, and may be a product for encapsulating an OED including an encapsulation film encapsulating an entire surface of the OED and an organic electronic element.

In addition, in one example, the encapsulation film may further include a dispersant such that the light absorbing material or the moisture absorbent may be uniformly dispersed. As the dispersant which can be used herein, for example, a non-ionic surfactant having affinity to a surface of the light absorbing material, and compatibility with the encapsulation resin may be used.

In one exemplary embodiment of the present invention, the light absorbing layer or the moisture barrier layer of the encapsulation film may further include a curing agent according to a type of the encapsulation resin. For example, a curing agent which can form a crosslinking structure by a reaction with the above-described encapsulation resin, or an initiator which can initiate a curing reaction of the resin may be further included.

A suitable type of the curing agent may be selected and used according to a type of the encapsulation resin or a type of a functional group included in the resin.

In one example, when the encapsulation resin is an epoxy resin, as a curing agent of the epoxy resin known in the art, for example, one or at least two of an amine curing agent, an imidazole curing agent, a phenol curing agent, a phosphorus curing agent, and an acid anhydride curing agent may be used, but the present invention is not limited thereto.

In one example, as the curing agent, an imidazole compound which is a solid at room temperature, and having a melting point or degradation temperature of 80° C. or more may be used. Such a compound may be, but is not limited to, for example, 2-methyl imidazole, 2-heptadecyl imidazole, 2-phenyl imidazole, 2-phenyl-4-methyl imidazole, or 1-cyanoethyl-2-phenyl imidazole.

A content of the curing agent may be selected according to, for example, the type or ratio of the encapsulation resin. For example, the curing agent may be included at 1 to 20, 1 to 10, or 1 to 5 parts by weight with respect to 100 parts by weight of the encapsulation resin. However, the weight ratio may be changed according to the type and ratio of the encapsulation resin or a functional group of the resin, or a crosslinking density to be realized.

When the encapsulation resin is a resin that may be cured by radiation of active energy rays, as an initiator, for example, a cationic photopolymerization initiator may be used.

As the cationic photopolymerization initiator, an onium salt- or organometallic salt-series ionized cationic initiator, or an organic silane- or latent sulfonic acid-series ionized cationic photopolymerization initiator, or a non-ionized cationic photopolymerization initiator may be used. The onium salt-series initiator may be a diaryliodonium salt, a triarylsulfonium salt, or an aryldiazonium salt, the organometallic salt-series initiator may be iron arene, the organic silane-series initiator may be o-nitrobenzyl triaryl silyl ether, triaryl silyl peroxide, or acyl silane, and the latent sulfonic acid-series initiator may be α-sulfonyloxy ketone or α-hydroxymethylbenzoin sulfonate, but the present invention is not limited thereto.

In one example, as the cationic initiator, an ionized cationic photopolymerization initiator may be used.

In addition, when the encapsulation resin is a resin which can be cured by the radiation of active energy rays, as an initiator, for example, a radical initiator may be used.

The radical initiator may be a photoinitiator or a thermal initiator. A specific type of the photoinitiator may be suitably selected in consideration of a curing speed and yellowing probability. For example, the photoinitiator may be a benzoin-, hydroxy ketone-, amino ketone-, or phosphine oxide-based photoinitiator, and specifically, benzoin, benzoin methylether, benzoin ethylether, benzoin isopropylether, benzoin n-butylether, benzoin isobutylether, acetophenone, dimethylamino acetophenone, 2,2-dimethoxy-2-phenylacetophenone, 2,2-diethoxy-2-phenylacetophenone, 2-hydroxy-2-methyl-1-phenylpropane-1-one, 1-hydroxy cyclohexylphenylketone, 2-methyl-1-[4-(methylthio)phenyl]-2-morpholino-propane-1-one, 4-(2-hydroxyethoxy)phenyl-2-(hydroxy-2-propyl)ketone, benzophenone, p-phenylbenzophenone, 4,4'-diethylamino benzophenone, dichlorobenzophenone, 2-methyl anthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, benzyldimethylketal, acetophenone dimethylketal, p-dimethylamino benzoic acid ester, oligo[2-hydroxy-2-methyl-1-[4-(1-methylvinyl)phenyl]propanone], or 2,4,6-trimethylbenzoyl-diphenyl-phosphineoxide.

A content of the initiator, like the curing agent, may be changed according to the type and ratio of the encapsulation resin or a functional group of the resin, or a crosslinking density to be realized. For example, the initiator may be included at 0.01 to 10 parts by weight or 0.1 to 3 parts by weight with respect to 100 parts by weight of the encapsulation resin.

The light absorbing layer or moisture barrier layer of the encapsulation film of the present invention may further include a high molecular weight resin. When the encapsulation composition of the present invention is molded in a film or sheet shape, the high molecular weight resin may serve to improve moldability. In addition, when a hot melting process is performed, the high molecular weight resin may serve as a high temperature viscosity controlling agent for controlling flowability.

A type of the high molecular weight resin which can be used herein is not particularly limited as long as the resin has compatibility with another component of the encapsulation resin. A specific example of the high molecular weight resin which can be used herein is a resin having a weight average molecular weight of 20,000 or more, for example, one or a mixture of at least two of a phenoxy resin, an acrylate resin, a high molecular weight epoxy resin, an ultra high molecular weight epoxy resin, a high polarity functional group-containing rubber, and a high polarity functional group-containing reactive rubber, but the present invention is not limited thereto.

When the high molecular weight resin is included in the encapsulation composition of the present invention, the content of the resin is adjusted according to a desired physical property, and is not particularly limited. For example, in the present invention, the high molecular weight resin may be included at approximately 200 parts by weight or less, preferably 150 parts by weight or less, and more preferably approximately 100 parts by weight or less, with respect to 100 parts by weight of the encapsulation resin. As the content of the high molecular weight resin of the present invention is controlled to 200 parts by weight or less, compatibility with each component of the resin composition may be effectively maintained, and thus the resin may serve as an adhesive.

In the encapsulation composition constituting the light absorbing layer or moisture barrier layer according to the present invention, various additives may be included according to a use, a type of the encapsulation resin and a process of manufacturing an encapsulation film which will be described below without affecting the effect of the present invention, in addition to the above-described components. For example, the encapsulation composition may include a coupling agent, a crosslinking agent, a curable material, a tackifier, a UV stabilizer or an antioxidant in a suitable range of contents according to desired physical properties. Here, the curable material may mean a material having a heat-curable functional group and/or an active energy ray-curable functional group separately included, other than the above-described components constituting the encapsulation composition. For example, the curable material may mean a compound including at least two of functional groups which can participate in polymerization by the radiation of active energy rays, for example, a functional group including an ethylenically unsaturated double bond such as an acryloyl group or a methacryloyl group, and a functional group such as an epoxy group or an oxetane group.

In an exemplary embodiment of the present invention, the encapsulation film may further include a metal layer, in addition to the light absorbing layer or the moisture barrier layer. The metal layer according to an exemplary embodiment of the present invention may be transparent or opaque. The metal layer may be a thin film-type metal foil, or a layer formed by depositing a metal on a polymer base film. The metal layer may be formed of any material that can have thermal conductivity and a moisture barrier property without limitation. The metal layer may include any one of a metal, a metal oxide, a metal nitride, a metal carbide, a metal oxynitride, a metal oxyboride, and a mixture thereof. For example, the metal layer may include an alloy prepared by adding at least one metallic element or non-metallic element to one metal, for example, an iron-nickel alloy or stainless steel (SUS). In addition, in one example, the metal layer may include copper, aluminum, nickel, silicon oxide, aluminum oxide, titanium oxide, indium oxide, tin oxide, tin-indium oxide, tantalum oxide, zirconium oxide, niobium oxide, and a mixture thereof. The metal layer may be deposited by means of electrolysis, rolling, evaporation, electron beam evaporation, sputtering, reactive sputtering, chemical vapor deposition, plasma chemical vapor deposition, or electron cyclotron resonance source plasma chemical vapor deposition. In one exemplary embodiment of the present invention, the metal layer may be deposited by reactive sputtering. In one exemplary embodiment of the present invention, the encapsulation film including the metal layer may prevent reflection or scattering of external light in a non-deposited part of an electrical connection of the OED by the metal layer using the light absorbing region.

In one example, the metal layer may have a reflectance of 15 to 90, 18 to 88, or 20 to 86% in a specular component included (SCI) measurement. In addition, the metal layer may have a reflectance of 15 to 80, 18 to 75, 20 to 70, or 20 to 65% in a specular component excluded (SCE) measurement. Here, the SCI denotes total reflectance, and the SCE denotes an irregular reflectance caused by scattering. The reflectance may be measured by a known method in the art using, for example, the CM2006d produced by Konika Minolta (measurement condition: any one of the predetermined values from M/I+E, M/SCI, M/SCE, S/I+E, S/SCI and S/SCE, any one of the predetermined values from UV 0 to 100%, any one of the light sources from D65, D50, C, A, F2, F6, F7, F8, F10, F11 and F12, and an observation view of 10° or 2°). When the encapsulation film includes a metal layer, due to the difference in reflectance between the electrical metal connection of the OED and the metal layer, in the observation of the OED from an external environment, the electrical connection is observed. Particularly, when the light absorbing layer includes a moisture absorbent or a filler, or the moisture barrier layer includes a moisture absorbent or a filler, the light absorbing layer or the moisture barrier layer serves as an intermediate layer in which light is scattered. Accordingly, an effect of reducing a reflectance of a polarizer formed on one surface of the OED is degraded, and thus a part without the electrical metal connection is seen blurred. Therefore, as described above, the encapsulation film including the metal layer may prevent reflection or scattering of external light from a non-deposited part of an electrical connection of the OED by the metal layer using a light absorbing region.

The metal layer may have a thermal conductivity of 50 W/mK or more, 60 W/mK or more, 70 W/mK or more, 80 W/mK or more, 90 W/mK or more, 100 W/mK or more, 110 W/mK or more, 120 W/mK or more, 130 W/mK or more, 140 W/mK or more, 150 W/mK or more, 200 W/mK or more, or 250 W/mK or more. As the metal layer has the above-described high thermal conductivity, heat generated at a contact interface in a process of contacting the metal layer may be more rapidly emitted. In addition, due to the high thermal conductivity, heat accumulated in the operation of the OED is rapidly emitted to an external environment, and thus a temperature of the OED may be maintained lower, and the generation of a crack and a defect is reduced.

The term "thermal conductivity" used herein is a degree of an ability of a material to deliver heat through conduction, and a unit may be W/mK. The unit shows the degree in which heat is delivered from a material at the same temperature and distance, and is a unit of heat (watt) with respect to the unit of a distance (meter) and the unit of a temperature (Kelvin).

A structure of the encapsulation film of the present invention may be, but is not particularly limited to, for example, a structure including a base film or a releasing film (hereinafter, also referred to as a "first film"); and the light absorbing layer or the moisture barrier layer formed on the base film or the releasing film.

The encapsulation film of the present invention may further include a base film or a releasing film (hereinafter, also referred to as a "second film") formed on the light absorbing layer or moisture barrier layer.

A specific type of the first film which can be used in the present invention is not particularly limited. In the present invention, as the first film, for example, a polymer film generally used in the art may be used. In the present invention, for example, as the base or releasing film, a polyethyleneterephthalate film, a polytetrafluoroethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film may be used. In addition, one or both surfaces of the base film or releasing film of the present invention may be treated with suitable releasing treatment. As an example of a releasing agent used in the releasing treatment for the base film, an alkyd-, silicone-, fluorine-, unsaturated ester-, polyolefin- or wax-based releasing agent may be used, and in terms of thermal resistance, an alkyd-, silicone- or fluorine-based releasing agent is preferably used, but the present invention is not limited thereto.

In addition, a type of the second film which can be used in the present invention (hereinafter, referred to as a "cover film") is not particularly limited, either. For example, in the present invention, as the second film, in the above-listed category of the first film, the same or different type of film, compared to the first film, may be used. In addition, in the present invention, the second film may also be treated with a suitable releasing treatment.

In the present invention, a thickness of the above-described base film or releasing film (first film) may be, but is not particularly limited to, suitably selected according to a use. For example, the thickness of the first film in the present invention may be approximately 10 to 500 µm, and preferably 20 to 200 µm. When the thickness is less than 10 µm, the base film may be easily deformed in a manufacturing process, and when the thickness is more than 500 µm, economic feasibility is degraded.

In the present invention, a thickness of the second film is not particularly limited, either. In the present invention, for example, the thickness of the second film may be set the same as the first film. In the present invention, in consideration of processibility, the thickness of the second film may be set relatively smaller than that of the first film.

A thickness of the light absorbing layer or the moisture barrier layer included in the encapsulation film of the present invention is not particularly limited, and may be suitably selected according to the following condition in consideration of a use to which the film is applied. The thickness of the light absorbing layer or moisture barrier layer included in the encapsulation film of the present invention may be approximately 5 to 200 µm, and preferably 10 to 150 µm.

In the present invention, a method of manufacturing the encapsulation film is not particularly limited. For example, the encapsulation film may be manufactured by a method including a first operation of coating a base film or a releasing film with a coating solution including the above-described encapsulation composition; and a second operation of drying the coating solution coated in the first operation.

A method of stacking a light absorbing layer or a moisture barrier layer is not particularly limited. For example, the light absorbing layer or the moisture barrier layer formed on a separate releasing film may be laminated, thereby forming an encapsulation film having a multilayer structure, and a moisture barrier layer may be directly formed on the light absorbing layer, or vice versa.

In the method of manufacturing an encapsulation film of the present invention, a third operation of additionally pressing a base film or a releasing film on the coating solution dried in the second operation may be further included.

The first operation of the present invention is to prepare a coating solution by dissolving or dispersing the above-described encapsulation composition in a suitable solvent. In this operation, a content of the encapsulation resin included in the coating solution may be suitably controlled according to a desired moisture barrier property and film moldability.

A type of the solvent used in the preparation of the coating solution in the present invention is not particularly limited. However, when a drying time of the solvent is excessively long, or drying at a high temperature is needed, problems in workability or durability of the encapsulation film may occur, and thus a solvent having a volatilization temperature of 100° C. or less is preferably used. In the present invention, in consideration of film moldability, a small amount of a solvent having a volatilization temperature in the above range or more may be mixed. An example of the solvent which can be used in the present invention, one or a mixture of at least two of methylethylketone (MEK), acetone, toluene, dimethylformamide (DMF), methylcellosolve (MCS), tetrahydrofuran (THF) or N-methylpyrrolidone (NMP) may be used, but the present invention is not limited thereto.

In the first operation of the present invention, a method of coating a base film or a releasing film with the coating solution may be, but is not particularly limited to, for example, a known method such as knife coating, roll coating, spray coating, gravure coating, curtain coating, comma coating or lip coating.

The second operation of the present invention is to form a light absorbing layer or a moisture barrier layer by drying the coating solution coated in the first operation. That is, in the second operation of the present invention, the light absorbing layer or the moisture barrier layer may be formed by drying and removing the solvent by heating the coating solution coated on the film. Here, a drying condition is not particularly limited, and for example, the drying may be performed at 70 to 200° C. for 1 to 10 minutes.

In the method of manufacturing an encapsulation film of the present invention, after the second operation, a third operation of pressing an additional base film or releasing film on the light absorbing layer or moisture barrier layer formed on the film may be further performed.

The third operation of the present invention may be performed by pressing an additional releasing film or base film (cover film or second film) on the light absorbing layer or moisture barrier layer formed by coating the film with the coating solution and drying the coated layer though hot roll lamination or pressing.

In addition, as shown in FIG. 9, the present invention relates to an OED including a substrate 21; an organic electronic element 23 including a transparent electrode layer present on the substrate, an organic layer present on the transparent electrode layer and including at least an emitting layer and a reflective electrode layer present on the organic layer; and the encapsulation film 1 encapsulating an entire surface of the organic electronic element 23, and having a light absorbing region having a surface resistance of $10^{11}$ $\Omega/cm^2$ or more.

The organic layer may be formed in various structures further including various functional layers known in the art as long as including an emitting layer. A layer which can be included in the organic layer may be an electron injection layer, a hole blocking layer, an electron transport layer, a hole transport layer, and a hole injection layer.

Various materials and methods of forming the same known in the art may be used to form a hole or electron injection electrode layer and an organic layer, for example, an emitting layer, an electron injection or transport layer, or a hole injection or transport layer, but the present invention is not limited thereto.

The organic electronic element 23 of the present invention may be an OLED.

In one example, the OED according to the present invention may be a bottom-emitting OED.

The OED may further include a protective film protecting the organic electronic element between the encapsulation film and the organic electronic element.

In addition, the OED may include an encapsulation film further including a metal layer, and in this case, a cover substrate which will be described below may be omitted.

In yet another embodiment of the present invention, a method of manufacturing an OED includes forming an organic electronic element including a transparent electrode layer, an organic layer present on the transparent electrode layer and including at least an emitting layer and a reflective electrode layer present on the organic layer on a substrate; and applying the above-described encapsulation film to the substrate on which the organic electronic element is formed to encapsulate an entire surface of the organic electronic element.

The operation of applying the encapsulation film to the OED may be performed by hot roll lamination, hot pressing or vacuum pressing of the encapsulation film, but the present invention is not particularly limited thereto.

The operation of applying the encapsulation film to the OED may be performed at 50 to 90° C., and then curing may be performed thereon by heating at a temperature range of 70 to 110° C. or radiating UV rays.

FIG. 9 is a cross-sectional view of an OED according to an exemplary embodiment of the present invention.

According to the method of manufacturing an OED in the present invention, for example, a transparent electrode is formed on the substrate 21 such as a glass or a film by vacuum deposition or sputtering, and an organic material layer is formed on the transparent electrode. The organic material layer may include a hole injection layer, a hole transport layer, an emitting layer, an electron injection layer and/or an electron transport layer. Subsequently, a second electrode is further formed on the organic material layer. Afterward, the above-described encapsulation film 1 is applied to an upper portion of an OED 23 on the substrate 21 to entirely cover the OED 23. Here, the method of applying the encapsulation film 1 is not particularly limited, and may be heating, pressing or autoclaving a cover substrate 22 (e.g., a glass or a polymer film) to which the encapsulation film 1 of the present invention is previously transferred, for example, on the OED 23 formed on the substrate 21. In this operation, for example, when the encapsulation film 1 is transferred to the cover substrate 22, the encapsulation film 1 may be transferred to the cover substrate 22 through a vacuum press or a vacuum laminator while heated, after a base or releasing film formed on the film may be delaminated. In this operation, when curing of the encapsulation film 1 is performed in a predetermined range or more, a cohesive strength or an adhesive strength of the encapsulation film 1 may be decreased, and thus a process temperature may be controlled at approximately 100° C. or less, and a process time may be controlled within 5 minutes. Similarly, even when the cover substrate 22 to which the encapsulation film 1 is transferred is applied to the OED 23 through thermal pressing, a vacuum press or a vacuum laminator may be used. A temperature condition in this operation may be set as described above, and a process time may be set within 10 minutes.

In addition, in the present invention, an additional curing process may be performed on the encapsulation film to which the OED is pressed, and such a curing process (main curing) may be performed, for example, in a heating chamber or a UV chamber, and preferably a heating chamber. A condition of the main curing may be suitably selected in consideration of stability of the OED.

However, the above-described manufacturing process is merely an example to encapsulate the OED of the present invention, and the process sequence or process condition may be changed without limitation. For example, in the present invention, a sequence of the transferring and pressing processes may be changed into transferring the encapsulation film 1 of the present invention to the OED 23 on the substrate 21, and pressing the cover substrate 22. In addition, a protective layer may be formed on the OED 23, the encapsulation film may be applied to the protective layer, and then curing may be performed thereon without the cover substrate 22.

EFFECT

When an OED is encapsulated using an encapsulation film according to exemplary embodiments of the present invention, an excellent moisture barrier property can be realized, and as reflection or scattering of light is prevented by absorbing and blocking internal or external light, external defects of the OED can be prevented.

DESCRIPTION OF REFERENCE NUMERALS

Figure 1:
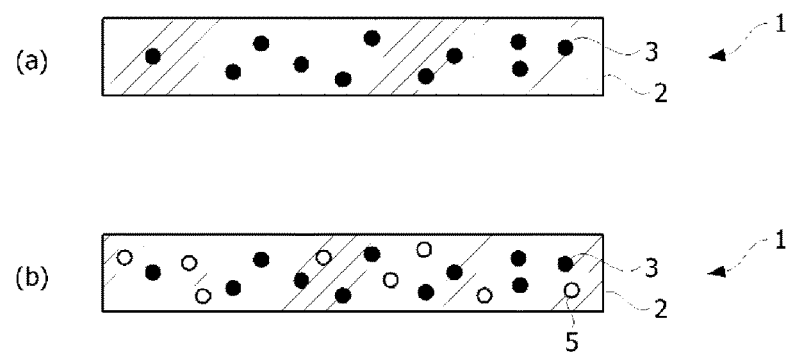
FIGS. 1 to 4 are cross-sectional views of an encapsulation film according to an exemplary embodiment of the present invention.
Figure 2:
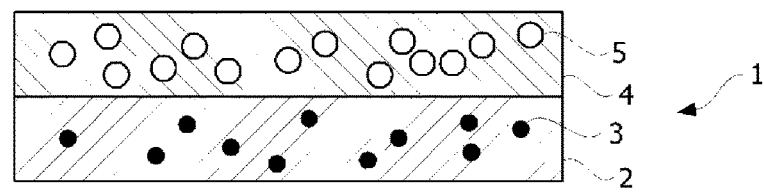
Figure 3:
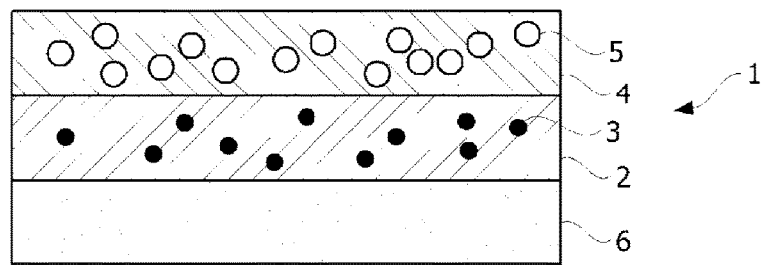
Figure 4:
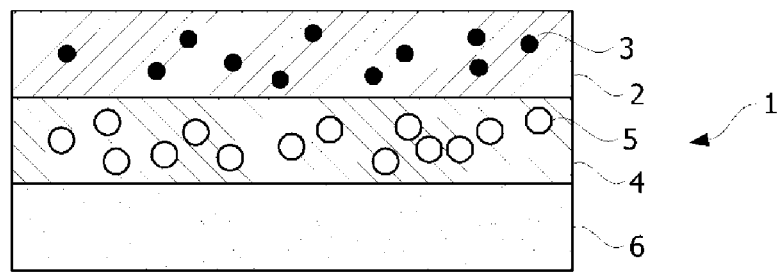
Figure 5:
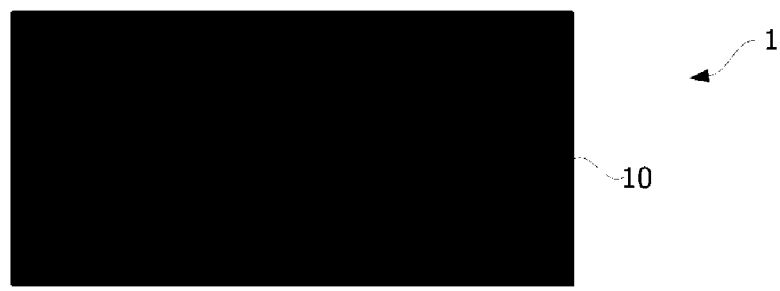
FIGS. 5 to 8 are plan views of an encapsulation film according to an exemplary embodiment of the present invention.
Figure 6:
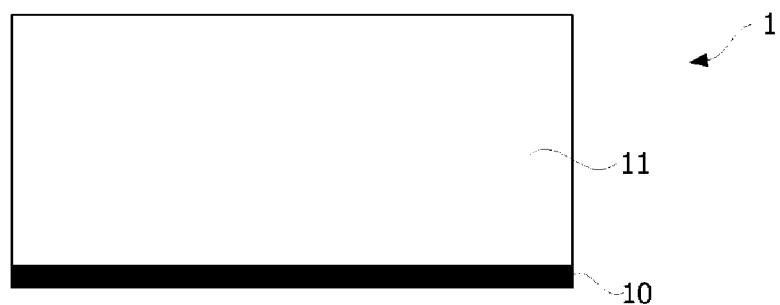
Figure 7:
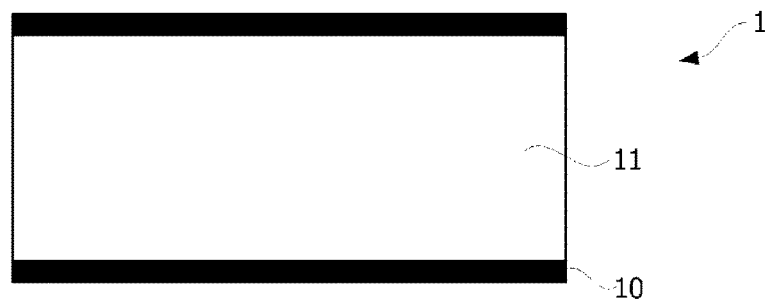
Figure 8:
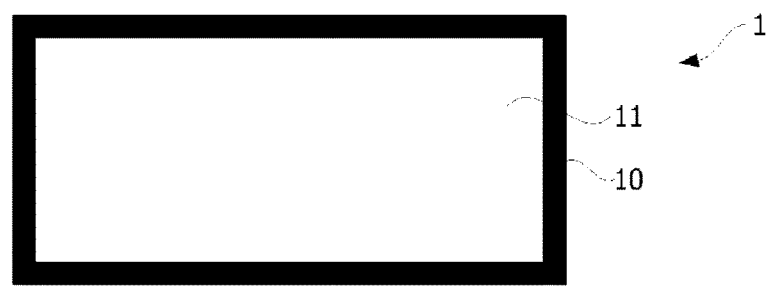
Figure 9:
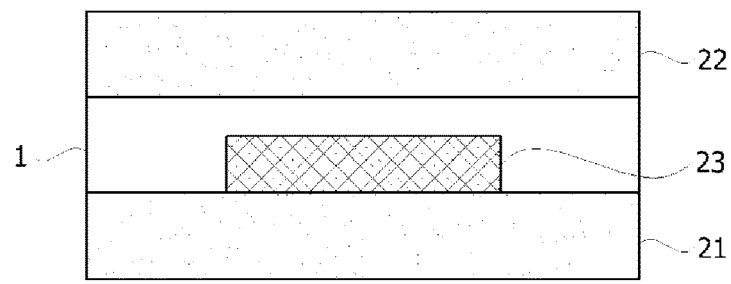
FIG. 9 is a cross-sectional view of an OED according to an exemplary embodiment of the present invention.

1: encapsulation film
2: light absorbing layer
3: light absorbing material
4, 6: moisture barrier layer
5: moisture absorbent
10: first region (light absorbing region)
11: second region (non-light absorbing region)
21: substrate
22: cover substrate
23: organic electronic element

DETAILED DESCRIPTION OF EXEMPLARY EMBODIMENTS

Hereinafter, exemplary embodiments of the present invention will be described in detail with reference to Examples according to the present invention and Comparative Examples not according to the present invention. However, the scope of the present invention is not limited to the embodiments which will be disclosed below.

Example 1

A carbon black dispersed solution was prepared by adding carbon black (#2600 Mitsubishi Carbon black) having a primary particle size of approximately 20 nm or less as a light absorbing material and methylethylketone (MEK) as a solvent in a solid concentration of 10 wt %. Meanwhile, a moisture absorbent solution was prepared by adding 100 g of calcined dolomite as a moisture absorbent and MEK as a solvent in a solid concentration of 50 wt %.

200 g of a silane-modified epoxy resin (KSR-177, Kukdo Chemical Co., Ltd.) and 150 g of a phenoxy resin (YP-50, Tohto Kasei Co., Ltd.) were added to a reactor at room temperature, and diluted with MEK. A solution for a light absorbing layer was prepared by adding 4 g of an imidazole (Shikoku Chemicals Corporation) as a curing agent to the homogenized solution, and stirring the resulting solution at a high speed for 1 hour. The solution for a light absorbing layer was prepared by adding the previously prepared moisture absorbent solution to the solution to have a content of calcined dolomite of 30 parts by weight with respect to 100 parts by weight of an encapsulation resin of a light absorbing layer, adding the carbon black dispersed solution to have a carbon black content of 10 parts by weight with respect to 100 parts by weight of the encapsulation resin of the light absorbing layer, and mixing the solutions.

An encapsulation film was manufactured by forming the light absorbing layer having a thickness of 20 μm by coating a releasing surface of a releasing PET film with the solution of the light absorbing layer and drying the coated solution at 130° C. for 3 minutes.

Example 2

A carbon black dispersed solution was prepared by adding carbon black (#2600 Mitsubishi Carbon black) having a primary particle size of approximately 20 nm or less as a light absorbing material and MEK as a solvent in a solid concentration of 10 wt %.

200 g of a silane-modified epoxy resin (KSR-177, Kukdo Chemical Co., Ltd.) and 150 g of a phenoxy resin (YP-50, Tohto Kasei Co., Ltd.) were added to a reactor at room temperature, and diluted with MEK. A solution for a light absorbing layer was prepared by adding 4 g of an imidazole (Shikoku Chemicals Corporation) as a curing agent to the homogenized solution, and stirring the resulting solution at a high speed for 1 hour. The solution for a light absorbing layer was prepared by adding and mixing the previously prepared carbon black dispersed solution to the resulting solution to have a carbon black content of 10 parts by weight with respect to 100 parts by weight of an encapsulation resin of a light absorbing layer.

Meanwhile, a moisture absorbent solution was prepared by adding 100 g of calcined dolomite as a moisture absorbent and MEK as a solvent at a solid content of 50 wt %.

200 g of a silane-modified epoxy resin (KSR-177, Kukdo Chemical Co., Ltd.) and 150 g of a phenoxy resin (YP-50, Tohto Kasei Co., Ltd.) were added to a reactor at room temperature, and diluted with MEK. A solution for a moisture barrier layer was prepared by adding 4 g of an imidazole (Shikoku Chemicals Corporation) as a curing agent to the homogenized solution, and stirring the resulting solution at a high speed for 1 hour. The previously prepared moisture absorbent solution was added to the solution to have a content of calcine dolomite of 30 parts by weight with respect to 100 parts by weight of the encapsulation resin of a moisture barrier layer.

A moisture barrier layer having a thickness of 20 μm was formed by coating a releasing surface of a releasing PET film with the solution of the moisture barrier layer, and drying the resulting surface at 130° C. for 3 minutes. According to the same method as described above, a light absorbing layer having a thickness of 10 μm was formed by coating a releasing surface of a releasing PET film with the solution of the light absorbing layer, and drying the resulting surface at 130° C. for 3 minutes. The moisture barrier layer and the light absorbing layer were laminated, thereby manufacturing an encapsulation film having a bilayer structure including the moisture barrier layer and the light absorbing layer.

Example 3

A moisture barrier layer having a thickness of 20 μm was formed by coating a releasing surface of a releasing PET film with the solution of the moisture barrier layer prepared in Example 2, and drying the resulting surface at 130° C. for 3 minutes. According to the same method as described above, a light absorbing layer having a thickness of 5 μm was formed by coating a releasing surface of a releasing PET film with the solution of the light absorbing layer prepared in Example 2, and drying the resulting surface at 130° C. for 3 minutes.

The moisture barrier layer and the light absorbing layer were laminated to have a triple layer structure including the light absorbing layer/moisture barrier layer/light absorbing layer, thereby manufacturing an encapsulation film.

Example 4

An encapsulation film was manufactured by the same method as described in Example 1, except that a carbon black dispersed solution was added to have a carbon black content of 1 part by weight with respect to 100 parts by weight of an encapsulation resin of a light absorbing layer.

Example 5

An encapsulation film was manufactured by the same method as described in Example 2, except that a moisture absorbent was added to have a content of 10 parts by weight with respect to 100 parts by weight of an encapsulation resin.

Comparative Example 1

An encapsulation film was manufactured by the same method as described in Example 1, except that carbon black (#3030B, Mitsubishi Carbon black, approximately 55 nm) having conductivity was added as a carbon black at 15 parts by weight with respect to 100 parts by weight of an encapsulation resin.

Comparative Example 2

An encapsulation film was manufactured by the same method as described in Example 2, except that carbon black (#3030B, Mitsubishi Carbon black, approximately 55 nm)

having conductivity was added as a carbon black at 10 parts by weight with respect to 100 parts by weight of an encapsulation resin.

Comparative Example 3

An encapsulation film was manufactured by the same method as described in Comparative Example 2, except that a moisture absorbent was added at 5 parts by weight with respect to 100 parts by weight of an encapsulation resin.

1. Measurement of Light Transmittance and Haze

A light transmittance of a light absorbing region of the film manufactured above was measured at 550 nm using an UV-Vis spectrometer. When the film was manufactured in a single layer structure, the light transmittance was measured on the light absorbing region of a light absorbing layer in a thickness direction, and when the film was manufactured in a multilayer structure, the light transmittance was measured on the light absorbing region in a thickness direction in a state in which a plurality of layers were stacked.

In addition, a haze was measured according to a JIS K7105 standard test method using a haze meter. The haze was measured on an entire area of the light absorbing layer when the film was manufactured in a single layer structure, and measured on an entire area in a state in which a plurality of layers were stacked when the film was manufactured in a multilayer structure.

2. Measurement of Surface Resistance

A surface resistance was measured on the light absorbing region of the film manufactured in the Examples or Comparative Examples according to a standard test method using an MCP-HT450 surface resistance meter manufactured by Mitsubishi Chemical Corporation. The surface resistance was measured on the light absorbing region of the encapsulation film from which a releasing film was removed, and measured after 500 V of voltage was applied for 1 minute at 23° C. and R.H. The surface resistance was measured on the light absorbing region of the light absorbing layer when the film was manufactured in a single layer structure, and measured on the light absorbing region in a state in which a plurality of layers were stacked when the film was manufactured in a multilayer structure.

3. Defect in Driving of Panel

An OED panel was manufactured by thermal-laminating the encapsulation film manufactured in the Examples or Comparative Examples between a TFT on which an organic electronic element was deposited and a glass. Here, the encapsulation film was attached such that the light absorbing layer was in contact with a TFT surface. When power was supplied to the panel manufactured as described above, and a short occurred or a bright dot was generated, it was represented as O, and when a short did not occur or a bright dot was not generated, it was represented as X.

TABLE 1

| | Light transmittance (%) | Haze (%) | Surface resistance ($\Omega/cm^2$) | Defect in driving of panel |
|---|---|---|---|---|
| Example 1 | 0.5 | 88 | $10^{13}$ | X |
| Example 2 | 3 | 76 | $10^{14}$ | X |
| Example 3 | 3.5 | 74 | $10^{12}$ | X |
| Example 4 | 15 | 80 | $10^{13}$ | X |
| Example 5 | 2.8 | 44 | $10^{12}$ | X |
| Comparative Example 1 | 0 | Impossible to measure | $10^{10}$ | O |
| Comparative Example 2 | 4 | 74 | $10^8$ | O |
| Comparative Example 3 | 3.8 | 34 | $10^8$ | O |

What is claimed is:

1. An encapsulation film for an organic electronic element, comprising:
a light absorbing region comprising an encapsulation resin and a light absorbing material, and having a surface resistance of $10^{11}$ $\Omega/cm^2$ or more.

2. The film according to claim 1, wherein the light absorbing region is formed in at least one outer peripheral part of the encapsulation film.

3. The film according to claim 1, wherein the light absorbing region is formed in an entire area of the encapsulation film.

4. The film according to claim 1, which has a haze of 40% to 90%.

5. The film according to claim 1, wherein the encapsulation resin comprises an acrylic resin, an epoxy resin, a silicone resin, a fluorine resin, a styrene resin, a polyolefin resin, a thermoplastic elastomer, a polyoxyalkylene resin, a polyester resin, a polyvinylchloride resin, a polycarbonate resin, a polyphenylenesulfide resin, a polyamide resin or a mixture thereof.

6. The film according to claim 1, wherein the encapsulation resin comprises a curable resin.

7. The film according to claim 6, wherein the curable resin is a heat-curable resin.

8. The film according to claim 6, wherein the curable resin comprises at least one curable functional group selected from a glycidyl group, an isocyanate group, a hydroxyl group, a carboxyl group, an amide group, an epoxide group, a cyclic ether group, a sulfide group, an acetal group, and a lactone group.

9. The film according to claim 6, wherein the curable resin is an epoxy resin comprising a cyclic structure in a molecular structure.

10. The film according to claim 6, wherein the curable resin is a silane-modified epoxy resin.

11. The film according to claim 1, wherein the light absorbing material is a non-conductive material.

12. The film according to claim 1, wherein the light absorbing material is at least one selected from the group consisting of carbon black, carbon nanotube, fluorene, a phthalocyanine derivative, a porphyrin derivative, and a triphenylamine derivative.

13. The film according to claim 1, wherein the light absorbing material is comprised at 0.01 to 50 parts by weight with respect to 100 parts by weight of the encapsulation resin.

14. The film according to claim 1, further comprising a moisture absorbent.

15. The film according to claim 14, wherein the moisture absorbent is at least one selected from the group consisting of $P_2O_5$, $Li_2O$, $Na_2O$, BaO, CaO, MgO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

16. The film according to claim 1, comprising:
a light absorbing layer comprising the light absorbing region; and
a moisture barrier layer.

17. The film according to claim 16, wherein the moisture barrier layer has a water vapor transmission rate (WVTR) of 50 g/m²·day or less.

18. The film according to claim 1, further comprising:
a metal layer.

19. The film according to claim 18, wherein the metal layer has a thermal conductivity of 50 W/mK or more.

20. The film according to claim 18, wherein the metal layer has a reflectance of 15 to 90% in Specular Component Included SCI measurement, or 15 to 80% in Specular Component Excluded SCE measurement.

21. An organic electronic device, comprising:
a substrate;
an organic electronic element comprising a transparent electrode layer present on the substrate, an organic layer present on the transparent electrode layer and comprising at least an emitting layer, and a reflective electrode layer present on the organic layer; and
an encapsulation film encapsulating an entire surface of the organic electronic element, and comprising a light absorbing region having a surface resistance of $10^{11}$ Ω/cm² or more.

22. The organic electronic device according to claim 21, wherein the light absorbing region is formed in at least one outer peripheral part of the encapsulation film.

23. The organic electronic device according to claim 21, wherein the light absorbing region is formed in an entire area of the encapsulation film.

24. The organic electronic device according to claim 21, wherein the encapsulation film further comprises a metal layer.

25. A method of manufacturing an organic electronic device, comprising:
forming an organic electronic element comprising a transparent electrode layer, an organic layer present on the transparent electrode layer and comprising at least an emitting layer and a reflective electrode layer present on the organic layer, on a substrate; and
applying the encapsulation film of claim 1 to the substrate on which the organic electronic element is formed to encapsulate an entire surface of the organic electronic element.

* * * * *